United States Patent
Bobbio et al.

[11] Patent Number: 6,013,381
[45] Date of Patent: Jan. 11, 2000

[54] FLUORINATED FLUXLESS SOLDERING

[75] Inventors: Stephen M. Bobbio, Wake Forest; Glenn A. Rinne, Cary, both of N.C.

[73] Assignee: MCNC, Research Triangle Park, N.C.

[21] Appl. No.: 08/929,429

[22] Filed: Sep. 15, 1997

Related U.S. Application Data

[62] Division of application No. 08/761,712, Dec. 6, 1996, abandoned, and a division of application No. 08/439,591, May 12, 1995, Pat. No. 5,615,825.

[51] Int. Cl.⁷ ..................................................... C23C 8/06
[52] U.S. Cl. ........................... 428/628; 428/643; 428/644
[58] Field of Search ..................................... 428/643, 644, 428/621, 628, 636; 174/256, 257; 228/56.3, 205, 208, 254

[56] References Cited

U.S. PATENT DOCUMENTS

| | | |
|---|---|---|
| 4,646,958 | 3/1987 | Howard, Jr. . |
| 4,821,947 | 4/1989 | Nowotarski . |
| 4,919,729 | 4/1990 | Elmgren et al. . |
| 4,921,157 | 5/1990 | Dishon et al. . |
| 4,937,006 | 6/1990 | Bickford et al. . |

FOREIGN PATENT DOCUMENTS

| | | |
|---|---|---|
| 3442538A1 | 7/1985 | Germany . |
| 2-303676 | 12/1990 | Japan ..................................... 228/206 |

OTHER PUBLICATIONS

P.A. Moskowitz, et al., Summay Abstract: Laser–Assisted Dry Processing Soldering, J. Vac. Sci. Tech. 3 (May/Jun., 1985).

Dry Soldering Process Using Halogenated Gas, dated Apr., 1985, IBM Technical Disclosure Bulletin, vol. 27, No. 11, p. 6513.

P.A. Moskowitz, et al., Thermal Dry Process Soldering, J. Vac. Sci. Tech. 4 (May/Jun., 1986), pp. 838–840.

*Primary Examiner*—Samuel M. Heinrich
*Attorney, Agent, or Firm*—Alston & Bird LLP

[57] ABSTRACT

A method for pretreating a solder surface for fluxless soldering is disclosed. The method uses a noble fluorine gas to remove surface oxides from solder surfaces, without the use of external stimulation. A noble fluorine gas is suffused across the solder surface to reduce or eliminate or chemically convert the surface oxides. The process can take place at atmospheric pressure and room temperature. A simple belt driven transport may be used to move the parts past a nozzle which emits the vapor in a system similar to a conventional solder reflow machine.

9 Claims, 1 Drawing Sheet

FLUORINATED FLUXLESS SOLDERING

This application is a divisional of Ser. No. 08/761,712, filed Dec. 6, 1996, now abandoned and a divisional of Ser. No. 08/439,591 filed May 12, 1995 U.S. Pat. No. 5,615,825.

FIELD OF THE INVENTION

This invention relates to soldering methods and systems, and more particularly to fluxless soldering in a fluorine enriched environment to reduce surface oxides.

INCORPORATION OF RELATED DISCLOSURES

This specification incorporates by reference U.S. Pat. No. 4,921,157 issued on May 1, 1990, application Ser. No. 08/155,020 filed Nov. 19, 1993 now U.S. Pat. No. 5,407,121, and application Ser. No. 08/339,770 filed Nov. 15, 1994 now U.S. Pat. No. 5,999,754, as a division of application Ser. No. 08/155,020, now U.S. Pat. No. 5,407,121, all assigned to MCNC, Research Triangle Park, N.C.

BACKGROUND OF THE INVENTION

The ability to assemble an electronic circuit from various discrete components or integrated circuit chips requires that they be properly connected for electrical conductivity and fixed into position for long term mechanical integrity. Absent such good, long term mechanical stability and electrical conductivity the reliability of any circuit is seriously degraded.

Current fabrication techniques involve the use of electronic packaging substrates, such as printed circuit wiring boards that electrically connect and mechanically support various electrical elements, including discrete components (such as resistors, transistors, diodes, switching arrays, etc.) integrated circuit components (such as memory devices, microprocessors, multiplexers, etc.), and various other circuit elements (such as transformers, connectors, heat sinks, etc.). The contacts between the printed circuit board and the electrical device must have physical, chemical, electrical and mechanical integrity and stability.

Soldering is the primary process used for connecting the electrical elements to the printed circuit board and fixing them in position. Soldering involves the use of a low melting point metal alloy, usually of the lead-tin type, that will join metals together at temperatures around 450° F. In one technique, metal pads are formed on the exposed surface of the printed circuit board and receive a coating of solder, or a small solder bump. The electrically conducting leads on the circuit component are brought into contact with the metal pads, heat is applied to raise the temperature of the pads and leads, and the solder is then heated to reflow and join the leads and pads. When the solder cools it resolidifies, thereby providing mechanical strength and a unified electrical connection. However, most metallic surfaces, including the solder, metal pads and leads, will oxidize in normal use, hindering the soldering process or even causing it to fail.

Most soldering processes include three basic steps: (1) pre-cleaning and deoxidation of the solder surface; (2) solder reflow and/or reflow joining; and (3) post-soldering cleaning. The solder reflow is critical. The reheated solder must flow freely between the circuit board pad and electrical lead to provide an air tight seal and a strong mechanical bond. However, proper reflow can occur only after any oxide coating is removed from the surface to be soldered because the high melting point oxides will interfere with or even prevent wetting of the two surfaces to be joined.

Pre-cleaning is conducted to remove impurities and oxide from the surface of the metal and solder that would create electrical resistance, weaken mechanical stability, or cause long term degradation of the union. Different flux materials are used in the pre-cleaning to prepare the surface and facilitate an unimpeded reflow of the liquid solder to perform an air tight and conductive bond between the pad and electrical lead. Activated fluxes, such as zinc, ammonium chloride, mineral acid-containing materials, and the like, are typically used in "coarse" soldering applications, i.e., repairing coarse wiring in motors or houses. Highly acidic fluxes are used for soldering aluminum layers. Aluminum has a tenacious oxide layer which is chemically very inert and difficult to remove. Fluxes used with aluminum can contain metal chlorides, fluorides, and ammonium compounds.

Unfortunately, the corrosive nature of the fluxes is becoming increasingly incompatible with the sensitive microelectronic assemblies. For most microelectronic devices, the standard practice is to reduce the acid activity of the flux to a mildly activated or non-activated grade in an attempt to minimize the adverse effects of the flux on the components. The problem is exacerbated by the shrinking size of electrical components and bonding pads, the growing use of surface mount technology, and the increasing demand for flip-chip device bonding.

The post-soldering cleaning step removes any flux residue remaining from the precleaning and deoxidation steps. However, as the size of electronic components has continued to decrease, the gaps between assembled parts and the risk of solidification cavities in solder joints has made it difficult to do post-soldering cleaning. Inefficient or ineffective cleaning can reduce the long term reliability of the entire assembly, causing higher defect levels and higher rework costs. In addition, the chemical activity and physical abuse brought about by the post-soldering cleaning can have its own negative impact. Although some cleaning equipment, newer materials, and refined processes solve some of the problems, there may still be undesirable effects and environmental concerns.

A fluxless soldering process can replace the precleaning step and virtually eliminate the post-cleaning step, however, it is still necessary to deoxidize the surfaces to insure complete solder reflow and bonding.

Various attempts at fluxless soldering have been made but high temperatures or pressures are required, or it is necessary to provide external energy or stimulation to enable or catalyze the deoxidation process.

For example, P. Moskowitz, et al., J. Vac. Sci. Tech. 4, (May/June, 1986) describes a dry soldering process for solder reflow and bonding of lead-tin solder using halogen containing gases for the reduction of the surface oxide to facilitate solder reflow. This process requires the use of a platinum catalyst mesh in a vacuum chamber with a temperature in excess of 300° C., which can damage delicate electronic components.

IBM Technical Disclosure Bulletin 27 (April, 1985) describes the use of halogenated gases in an inert gas carrier at elevated temperatures to produce a reduction of solder oxides by the reactive gas and to allow solder reflow. This process requires high temperatures.

P. Moskowitz, et al., J. Vac. Sci. Tech. 3 (May/June, 1985) describes a laser-assisted fluxless soldering technique for solder reflow. However, laser radiation is required to excite an otherwise non-reactive gas in the presence of a preheated solder surface. This technique requires direct access of the laser beam to the solder surface, thus limiting the applications as well as resulting in a low throughput process.

U.S. Pat. No. 4,921,157 discloses a fluxless soldering process for semiconductor devices. Solder surface oxides are removed in a fluorine-containing plasma assisted process before it is reflowed.

German Patent No. 3,442,538 discloses a method of soldering semiconductor elements where a semiconductor element having an aluminum layer is subjected to a fluorine-containing plasma. The treated aluminum surface is then contacted with a soft solder. Process conditions include treating the aluminum layer with a fluorine-containing plasma for about one hour in a vacuum at a temperature of about 197° C. to 397° C. Thus, high temperatures are required, and throughput is limited.

U.S. Pat. No. 4,646,958 describes a fluxless soldering process using silane ($SiH_4$) at elevated temperatures of about 350° C. to about 375° C.

U.S. Pat. No. 4,821,947 describes a wave soldering process which is performed in an inert atmosphere at temperatures below 300° C., but a reflow process is not described.

U.S. Pat. No. 4,919,729 discloses a soldering paste which may be used in a reducing atmosphere to eliminate flux. However, a reducing atmosphere of hydrogen, heated to approximately 300° C. to 500° C., is required.

U.S. Pat. No. 4,937,006 describes the use of a gas, heated to a temperature sufficient to melt solder, which is directed at the molten solder at a momentum sufficient to disperse the oxide layer at the surface of the molten solder. This dispersion allows the oxide layer to wet the solder wettable surface.

SUMMARY OF THE INVENTION

It is an object of the present invention to provide an improved soldering process.

It is another object of the present invention to provide an improved fluxless soldering process.

It is another object of the present invention to provide a soldering process without the need for a post-soldering cleanup.

It is another object of the present invention to provide improved solder flow.

These and other objects of the present invention are accomplished by exposing the solder surface to a vapor including a fluorine compound which deposits on the solder surface without the use of external stimulation. For example, by exposing the solder surface to a vapor of a noble gas fluorine compound, the surface oxides that inhibit reflow of the solder are dispersed or displaced sufficiently so that they do not prevent the wetting of the two surfaces to be joined during the solder reflow step.

The fluxless soldering process of the present invention is believed to produce fluorine atoms on the solder surface by dissociative adsorption at room temperature and atmospheric pressure. This is believed to yield a lead-tin alloy solder having fluorine atoms on the exposed surface thereof, which is believed to displace the oxygen in the tin oxide.

The process conditions of the present invention are flexible. They can be selected to optimize solder reflow and can be conducted in a conventional processing apparatus. External energy stimulation, high temperatures, vacuums, and high pressures are unnecessary. Moreover, the process gases may be recycled.

DESCRIPTION OF THE DRAWINGS

Other objects and advantages of the invention and the manner in which they are accomplished will be more completely understood with references to the detailed description and to the drawings in which.

DETAILED DESCRIPTION OF THE PREFERRED EMBODIMENT

Figure 1:
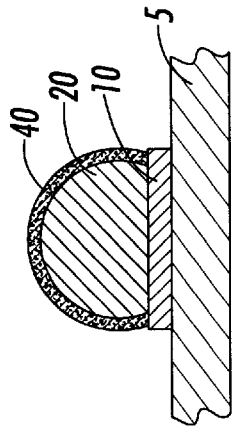
FIG. 1 shows a deposited solder with a surface oxide coating.

The present invention will now be described more fully with reference to the accompanying drawings, in which a preferred embodiment of the invention is shown. This invention can, however, be embodied in many different forms and should not be construed as limited to the embodiments set forth herein. Rather, applicants provide this embodiment so that this disclosure will be thorough and complete and will fully convey the scope of the invention to those skilled in the art. Like reference numerals refer to like elements throughout. For greater clarity, the thickness of the layers have been exaggerated, and the components of the processing apparatus have been shown schematically.

FIG. 1 shows a schematic side view representation of a circuit board 5 having an electrically conductive metal surface 10 attached to the surface thereof. Alternatively, surface 10 may be a surface mount board or another solder bearing surface. For example, it may be a flat surface or a tinned lead or other surface to be soldered, and it may include, for example, gold, tin or copper. The solder 20 is deposited on surface 10. The solder can be of any appropriate solder material such as tin, lead tin, and lead-tin based alloys. A typical eutectic 63% lead, 37% tin material, having a melting point of 183° C., would be appropriate. It may be a solder preform, solder coated on a surface, solder powder in a paste, or molten solder as in a solder wave reflow tool. The solder is shown in the shape of a ball, which is typical for microelectronic soldering processes, but it may also conform to any of a wide variety of surface configurations for soldering, and it may be applied using one of several techniques, forms, or media.

Surface oxides 25, such as tin oxide, form on the exposed outer surface of the solder 20 as a result of being exposed to oxygen or water vapor, including oxygen or water vapor present in the ambient atmosphere. It is the presence of these surface oxides that prevent or inhibit the solder reflow or the wetting of the surfaces to be solder joined, and must therefore be at least partially removed to obtain an appropriate electrical and mechanical connection.

Figure 2:
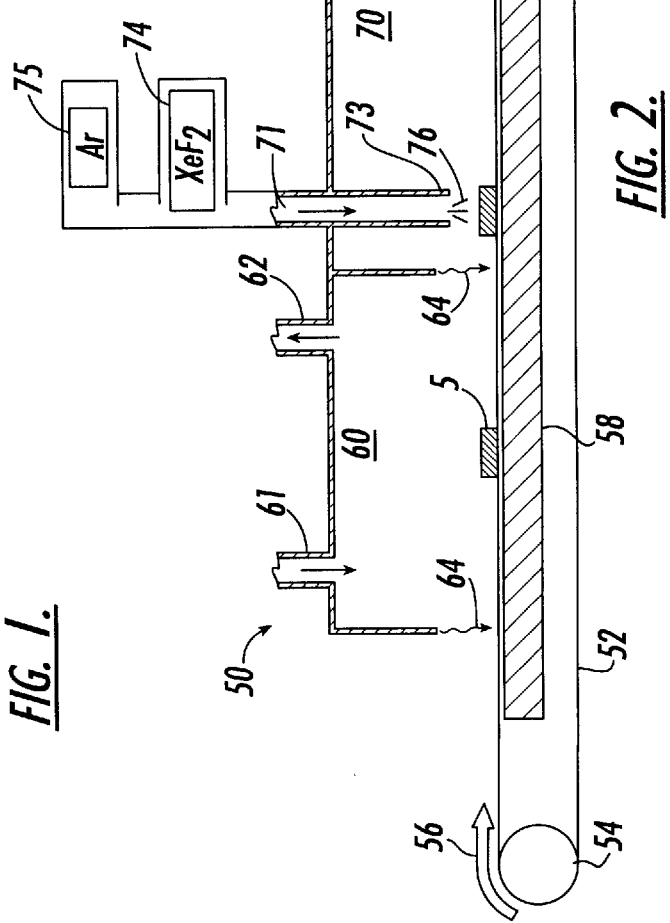
FIG. 2 shows an apparatus for practicing the method of the invention.

Referring now to FIG. 2, a gas processing apparatus 50 which can be used to practice the invention is illustrated. The transport mechanism includes an endless conveyor belt 52 that is driven by and passes over rollers 54 at opposite ends to advance the conveyor belt through the processing chambers in the direction of arrow 56. Support 58 provides vertical positioning of the conveyor belt as it passes through the processing chambers.

The processing apparatus includes three chambers 60, 70 and 80, arranged in sequence. They are illustrated being adjacent one another so that an item to be processed, such as a circuit board 5, will move sequentially through the three illustrated chambers.

The first chamber, purge chamber 60, includes walls defining a cavity above the circuit board 5 to be processed. The upper portion includes a mechanical structure or hood 63. The lower portion is defined by conventional air or safe gas curtains 64, e.g., dry nitrogen, to isolate the interior of chamber 60 from the ambient conditions and adjacent chambers, and to contain any gases introduced into the chamber. Alternatively, a load lock may be used. The conveyor belt 52 defines the lower portion of the chamber. The upper portion of the chamber, air curtains, and conveying mechanism are well known to those in the industry. One of the benefits of the present invention is that it may be practiced at room temperature and atmospheric pressure, greatly simplifying the construction of the processing apparatus and minimizing its cost. In the alternative, however, and as an added benefit of the invention, it may be practiced in a variety of environments and under a variety of conditions that will best fit with the various stations in an electronics manufacturing process requiring soldering. The purge chamber includes inlet 61 and exhaust 62 for the purge gas, such as argon or nitrogen, that is used to purify the ambient atmosphere for the circuit board and eliminate contaminants that would otherwise interfere with the fluorination process in the succeeding chamber.

Adjacent the purge chamber 60 is the processing chamber 70. Its construction is similar to that of the purge chamber and is separated therefrom by an air curtain 64 so that the circuit board may move unimpeded from the purge chamber to the processing chamber. A gas inlet 71 and exhaust 72 allow the processing gas to surround the solder carrying circuit board. The process gas is a weakly internally bonded fluorine gas, typically $XeF_2$, in an argon flow to carry the $XeF_2$ from its source to the solder surface. The $XeF_2$ source 74 may be a solid material, which is volatile and has a very low surface pressure, causing it to give off the desired fluorine compound enriched vapors. An inert carrier, such as an argon source 75, produces a gas flow which includes the $XeF_2$ as it passes through the processing gas inlet 71 to a nozzle 73 that will cause the reactive gas blend 76 to suffuse the solder surfaces on the circuit board. The exhaust port 72 may be used to collect the processing gas, which may be recycled.

Adjacent the processing chamber is an exhaust chamber 80 having a construction similar to the purge chamber 60. It is separated from the processing chamber 70 by a wall and an air curtain 64 which permits the circuit board 5 to freely move from the processing chamber into the exhaust chamber. An inlet port 81 and an exhaust port 82 for the purge gas clarifies the atmosphere surrounding the circuit board and removes any last traces of the $XeF_2$ or other noble fluorine compound used in the process.

The circuit board exits the processing apparatus through the air curtain 64, and may proceed to a subsequent processing station.

In operation, the solder or other surface on the circuit board 5 is directly fluorinated by vapors of a thermally dissociated source molecule. $XeF_2$, which is a solid material whose vapor pressure is approximately 6 Torr at 70° C., is the preferred fluorine source, but it is believed that any noble fluorine compound may used. A $XeF_2$ flow may take place at atmospheric pressure and without external thermal excitation or other energy sources or stimulation such as plasmas or lasers. $XeF_2$ is moisture sensitive and is well known to dissociatively adsorb on metallic surfaces. Under atmospheric pressure (760 Torr) the solid material vaporizes.

It is further believed that the $XeF_2$ dissociatively adsorbs on the metallic surface to replace the tin oxide with tin fluoride. Although the exact mechanism of this process is not understood, it is believed that the surface fluorine in the compound dissolves into the solder, or breaks up the surface oxide into colloidal-type particles, or replaces the tin oxide on the surface of the solder. Any other material which produces fluorine atoms on a metal surface by dissociative adsorption on the surface may also be used. It is believed that the following stoichiometric process occurs on a solder surface:

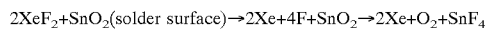

$$2XeF_2+SnO_2(\text{solder surface})\rightarrow 2Xe+4F+SnO_2\rightarrow 2Xe+O_2+SnF_4$$

The equation reflects that the $XeF_2$ reacts with the $SnO_2$ (tin oxide) on the solder surface to chemically convert it and yield free xenon and fluorine. The fluorine reacts with the tin oxide on the solder surface and is believed to ultimately yield free oxygen and tin-fluoride or it may yield water and tin oxyfluoride. In typical operation, the fluorination process is performed until the surface oxides have been sufficiently removed from the solder surface or chemically converted to facilitate reflow. Under typical circumstances the circuit board to be suffused with the noble fluorine gas for approximately 20 to 40 minutes in a vacuum partial pressure at 300 millitorr, or at atmospheric pressure with less than 10 percent of the process gas being $XeF_2$.

Figure 3:
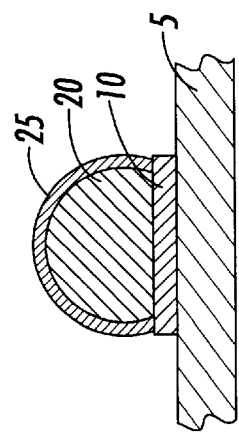
FIG. 3 shows a deposited solder with an adsorbed fluorine coating.

Fluorination is believed to result in the conversion of at least some of the oxide layer on the surface of the solder to tin fluoride or tin oxyfluoride, or may result in removal of at least some of the oxide layer from the surface of the solder and formation of a tin fluoride compound in its place, as shown schematically on the solder deposit in FIG. 3. It is similar to the solder deposit illustrated in FIG. 1, with the surface oxides 25 absent or replaced by a surface fluorine compound 40, consistent with the beliefs expressed regarding the mechanism of this process. The fluorinated solder is then reflowed to form a new solder bump or to reflow and join to a second surface. The second surface may be another component or solder compound and may be conducted under typical conditions used with conventional wet flux methods.

Because the process takes place at atmospheric pressure, a vacuum chamber is not necessary to practice this method, but one may be used. Moreover, since external temperatures or other energy stimulation is not necessary, such as a plasma or laser beam, the adverse effects of high temperature and complicated machinery may be avoided. A simple belt driven transport system may be used to move the solder bearing parts through a chamber containing a vapor phase noble fluorine gas. The chamber may or may not include a nozzle 73 to direct the gas flow. And, because the amount of fluorine needed is small, the concentration of the noble fluorine gas may be low. This transport system may be implemented in a system similar to a conventional solder reflow machine.

It is believed that this process is compatible with other pretreatment processes, such as oxygen plasma treatments. The oxygen plasma treatment will remove, by oxidation, any organic residue from the surface and eliminates any need for presolder cleaning.

In the drawings and specification there have been disclosed typical preferred embodiments and, although specific terms are employed, they are used in a generic and descriptive sense only and not for purposes of limitation. The scope of the invention is set forth within the following claims.

That which is claimed is:

1. A lead-tin alloy solder deposited on a surface for joining metals together after being heated to a reflow state, said solder comprising an underlying lead-tin solder having fluorine deposited on an exposed surface thereof by dissociative adsorption.

2. The solder of claim 1 wherein said fluorine comprises a noble gas fluoride compound.

3. The solder of claim 1, wherein said fluorine comprises tin fluoride.

4. The solder of claim 1, wherein said fluorine comprises tin oxyfluoride.

5. The solder of claim 1, wherein said fluorine comprises free fluorine ions.

6. A lead-tin solder deposited on a circuit board, wherein said solder comprises an underlying lead-tin solder having free fluorine ions deposited on an exposed surface thereof.

7. The solder of claim 6, wherein said fluorine comprises a noble gas fluoride compound.

8. The solder of claim 6, wherein said fluorine comprises tin fluoride.

9. The solder of claim 6, wherein said fluorine comprises tin oxyfluoride.

* * * * *

UNITED STATES PATENT AND TRADEMARK OFFICE
CERTIFICATE OF CORRECTION

PATENT NO. : 6,013,381
DATED : January 11, 2000
INVENTOR(S) : Bobbio et al.

It is certified that error appears in the above-identified patent and that said Letters Patent is hereby corrected as shown below:

Column 1, line 19, in the INCORPORATION OF RELATED DISCLOSURES, "5,999,754" should read --5,499,754--.

Signed and Sealed this

Twenty-fourth Day of October, 2000

Attest:

Q. TODD DICKINSON

*Attesting Officer*              *Director of Patents and Trademarks*